United States Patent [19]
Abiko et al.

[11] 4,259,905
[45] Apr. 7, 1981

[54] WATERLESS PLANOGRAPHIC PRINTING PLATE WITH POLYSILOXANE COATING

[75] Inventors: Shigeo Abiko; Tadami Kamaishi, both of Ohtsu, Japan

[73] Assignee: Toray Industries, Inc., Tokyo, Japan

[21] Appl. No.: 47,817

[22] Filed: Jun. 12, 1979

[30] Foreign Application Priority Data

Jun. 14, 1978 [JP] Japan .................................. 53-70800

[51] Int. Cl.$^3$ .................................................. G03F 7/02
[52] U.S. Cl. .................................... 101/467; 101/465; 430/302; 430/303; 430/49
[58] Field of Search ................. 430/303, 302, 296, 49; 101/465, 467

[56] References Cited

U.S. PATENT DOCUMENTS

| | | | |
|---|---|---|---|
| 3,063,872 | 11/1962 | Boldebuck | 430/296 |
| 3,894,873 | 7/1975 | Kobayashi et al. | 430/303 X |
| 4,009,032 | 2/1977 | Schank | 430/303 X |
| 4,012,254 | 3/1977 | Crystal | 430/49 X |
| 4,077,325 | 3/1978 | Pakanski et al. | 430/303 X |
| 4,078,927 | 3/1978 | Amidon et al. | 430/49 X |

*Primary Examiner*—Edward C. Kimlin
*Attorney, Agent, or Firm*—Miller & Prestia

[57] ABSTRACT

A waterless planographic printing plate having toner image areas of ink receptivity and non-image areas of ink releasability is provided, which plate has a substrate and an overlying layer coated on the substrate. The overlying layer is predominantly comprised of a reaction product of 50 to 99% by weight of a polymeric material having, on the average, at least two hydroxyl groups per molecule and exhibiting a high adhesion to the ink-receptive toner, and 1 to 50% by weight of an organopolysiloxane having hydroxyl end groups. The overlying layer preferably consists of a relatively thin surface layer substantially composed of the organopolysiloxane, and a relatively thick inner layer sandwiched between the surface layer and the substrate and having an islands-in-sea heterophase structure composed of the organopolysiloxane islands substantially uniformly dispersed in the sea of the polymeric material. The relatively thin surface layer has holes through which the inner layer predominantly composed of the polymeric material is exposed.

15 Claims, No Drawings

WATERLESS PLANOGRAPHIC PRINTING PLATE WITH POLYSILOXANE COATING

BACKGROUND OF THE INVENTION

1. Field of the Invention

This invention relates to a waterless planographic printing plate, i.e. a printing plate suitable for use in planographic printing, wherein need for conventional dampening with an aqueous fountain solution in the printing operation is obviated.

2. Description of the Prior Art

In conventional planographic printing, a printing plate is first dampened with an aqueous fountain solution in order to prevent ink from wetting the nonimaged areas of the printing plate, after which ink is rolled over the plate. The conventional planographic printing has some difficulties inherent in having both ink and a fountain solution. That is, first, the fountation solution applied to the printing plate flows back into the train of inking rollers on the press, causing emulsification of the ink. Secondly, control of the delicate balance between the amounts of ink and a fountain solution applied is difficult to maintain, and thus, the image fidelity and uniformity are difficult to maintain. Thirdly, the fountain solution tends to flow forward over the offset cylinder, moistening the copy paper and causing its dimensional change. Fourthly, in the case where the printing plate is imaged directly by electrophotography, the imaged printing plate must be subjected to an etching treatment and the printing operation becomes complicated.

Many attempts to avoid the above-mentioned difficulties have been made in which a printing plate with background areas that are ink-repellent, without being dampened by an aqueous fountain solution, is used. In general, such a printing plate comprises an overlying surface layer coated on a substrate of the printing plate, which layer is comprised of an ink-repellent material such as an organosilicone polymer or an organofluorine compound. The ink-repellent background areas are formed, for example, by a method wherein an unimaged printing plate having a substrate/photosensitive material/ink-repellent material triple layer structure is imaged and, then, either the imaged areas or the non-imaged areas are removed by a developing solution. Another method for forming the ink-repellent background areas involves depositing an ink-accepting particulate material (commonly referred to in the trade as "toner") onto an unimaged printing plate having a substrate/ink repellent double layer structure in image configuration, followed by heating the toner, thereby to fix it to the printing plate. Tha latter method is conveniently used for in-plant or in-house printing. However, since the ink-accepting toner is not firmly attached to the organosilicone polymer or organofluorine compound overlying layer, the imaged printing plate is poor in printing endurance, i.e., the toner is likely to become removed after a short run on a printing press.

In order to obviate the above-mentioned defect, some proposals have been made to form an overlying modified organopolysiloxane polymeric material layer on a substrate. For example, Japanese Laid-open Patent Application 1803/1975 discloses a planographic printing master having an overlying heterophase polymeric composition layer coated on a substrate, which polymeric composition is predominantly comprised of an organopolysiloxane copolymer, particularly a tri-block copolymer expressed by the formula "ABA" or a multiblock copolymer expressed by the formula (AB)n, wherein one of the A and B is a silicone phase, such as an organopolysiloxane, and the other is a non-silicone phase, such as plystyrene. U.S. Pat. Nos. 4,009,032 and 4,030,416 disclose a planographic printing master having an overlying siloxane block copolymer layer coated on a substrate, which siloxane block copolymer is comprised of siloxane blocks cured to an elastomeric ink releasing condition and organic thermoplastic blocks which are ink accepting. The overlying modified organopolysiloxane polymeric material layers disclosed in these prior art references exhibit enhanced adhesion to toner as compared with an overlying unmodified organopolysiloxane polymeric material layer. However, control of the delicate balance between the background contamination in non-image areas of prints and the printing endurance of the printing plate is difficult to maintain. This is because, in general, the lower the background contamination in non-image areas of prints, the lower the printing endurance of the printing plate. Furthermore, the modified organopolysiloxane polymeric material contains an organopolysiloxane in a relatively large proportion, which is expensive. Cumbersome polymerization procedures are necessary for the preparation of the modified organopolysiloxane polymeric material.

It has also been proposed in Japanese Laid-open Patent Application 29,305/1977 to employ an overlying organopolysiloxane elastomer layer which contains a minor amount of an organosiloxane unit having a reactive organic radical. This proposed method provides a printing plate of improved printing endurance, from which prints of reduced background contamination are obtainable. However, control of the delicate balance between the background contamination in prints and the printing endurance of the printing plate is still difficult to maintain. Furthermore, the organosiloxane having a reactive organic radical is costly in its production.

SUMMARY OF THE INVENTION

A main object of the present invention is to provide a waterless planographic printing plate having an overlying modified organopolysiloxane polymeric material layer, which plate exhibits extremely enhanced printing endurance and produces prints of satisfactorily low background contamination, and thus, it is not difficult to control the balance between the background contamination in prints and the printing endurance of the printing plate.

Other objects and advantages of the present invention will be apparent from the following description.

In accordance with the present invention there is provided a waterless planographic printing plate having toner image areas of ink receptivity and non-image areas of ink releasability, which plate comprises a substrate and an overlying layer coated on the substrate, said overlying layer is predominantly comprised of a reaction product of 50 to 99% by weight of a polymeric material having, on the average, at least two hydroxyl groups per molecule and exhibiting a high adhesion to the ink-receptive toner, and 1 to 50% by weight of an organopolysiloxane having hydroxyl end groups.

DESCRIPTION OF THE PREFERRED EMBODIMENTS

By the term "high adhesion to the ink-receptive toner", used herein, is meant that the polymeric material chemically and/or physically adheres to the ink-receptive toner to an extent such that the toner would not become removed after a short run on a printing press.

The polymeric materials exhibiting a high adhesion to the ink-receptive toner are preferably those which are capable of forming a uniform solution together with the organopolysiloxane used. Particularly, it is preferable that the difference in solubility parameter between the polymeric material and the organopolysiloxane is smaller than 2 $(cal/cm^{-3})^{\frac{1}{2}}$. The term "solubility parameter", used herein refers to "$\gamma$", which is defined by the following equation.

$$\gamma^2 = CED = E/V$$

wherein CED is cohesive energy density, E is cohesive energy in cal $mol^{-1}$ and V is molar volume.

Exemplary of suitable polymeric materials exhibiting a high adhesion to toner are condensation resins, such as alkyd resins, urea resins, melamine resins, phenol resins, epoxy resins, unsaturated polyester resins and epoxy-ester resins, and radical and ionic addition polymerization resins, such as 1,2-polybutadiene or its derivatives and acrylate or methacrylate resins. Of these polymeric materials, 1,2-polybutadiene and its derivatives are especially preferable.

If desired, the aforesaid condensation resins may be chemically modified in order to enhance their affinity to a silicone resin having silanol end groups. For example, with respect to alkyd resins, drying oil modification, epoxy-esterification, phenol modification, rosin modification and their combinations may be employed.

The polymeric material exhibiting a high adhesion to toner should have, on the average, at least two hydroxyl groups per molecule. The hydroxyl groups may be introduced in the polymeric material usually by copolymerizing a hydroxyl group-containing monomer with another monomer containing no hydroxyl group, or by reacting a polymeric material with a hydroxyl group-containing compound. For example, radical or ionic addition polymerization resins may be prepared by employing a hydroxyl group-containing ethylenically unsaturated comonomer, such as 2-hydroxyethyl methacrylate, 2-hydroxypropyl methacrylate and 2-hydroxy-3-phenoxypropyl acrylate.

The above-mentioned polymeric materials may be used either alone or in combination. The molecular weight of the polymeric materials may be varied in a wide range depending upon the particular polymeric materials, but is preferably not larger than approximately 10,000 in the case of condensation resins and liquid 1,2-polybutadiene or its derivatives, and not larger than approximately 20,000 in the case of the other addition polymerization resins. Liquid 1,2-polybutadiene and its derivatives, which possess a molecular weight of from approximately 500 to 5,000, are optimum.

The most preferable polymeric materials are, as mentioned above, liquid 1,2-polybutadiene and its derivatives. The 1,2-polybutadiene used should preferably have an 1,2-bond content of at least approximately 50%, more preferably at least 90%. Liquid 1,2-polybutadiene may be prepared by a living polymerization procedure wherein, for example, a dianion type compound is employed as a polymerization initiator. The polymer so prepared exhibits a molecular weight distribution of monodisperse. The termination of polymerization may be effected by using a suitable chain transfer agent which varies depending upon the intended end groups to be introduced into the polymer. For example, ethylene oxide may be used for the formation of hydroxyl end groups. The derivatives of 1,2-polybutadiene refer to those which are derived by chemically modifying a part of the hydroxyl groups or pendant double bonds of 1,2-polybutadiene. Such chemical modification includes, for example, urethanization, etherification, esterification, ene-addition, epoxidation, hydrogenation and chlorination.

The organopolysiloxane having hydroxyl end groups refers to those compounds which have a structure such that organosilicone groups, each having bonded thereto a hydrocarbon group, for example, a methyl, ethyl, vinyl or phenyl group, are linked to each other through the siloxane bond. A part of the organosilicone groups may be substituted by an organosilicone group having one or more polar or reactive organic groups. The organopolysiloxane may also have a structure such that only organosiloxane groups each having one or more polar groups are linked to each other through the siloxane bond. The polar group or groups, which may be introduced into the organopolysiloxane, include, for example, amino, epoxy, hydroxyl, carboxyl, aldehyde, mercapto, halogenated derivative, nitrile and imino groups.

The organopolysiloxane used has reactive silanol groups at both ends of the polymer chain, that is, it may be said that the organopolysiloxane has reactive hydroxyl end groups. Therefore, when the organopolysiloxane is reacted with the aforesaid polymeric material having, on the average, at least two hydroxyl groups, particularly with hydroxyl-terminated 1,2-polybutadiene or its derivatives, a block copolymer is produced. It is convenient that the reaction of the organopolysiloxane with the hydroxyl group-containing polymeric material is effected after a coating solution containing these two reactants is coated on a substrate. Usually, such a reaction may be effected by heating the coat formed on a substrate from the coating solution at a temperature of from room temperature to 250° C.

In order to complete the reaction within a practically reasonable period of time, a cross-linking agent and/or a cross-linking catalyst may be used.

The cross-linking agent used is a polyfunctional compound which is reactive to a hydroxyl group. Particularly preferable are silanes represented by the general formula:

$$R_{4-a}SiX_a$$

wherein R is a hydrocarbon radical having 1 to 18 carbon atoms, X is a hydrolyzable radical, such as a chlorine atom, an alkoxy group having 1 to 6 carbon atoms, an acyloxy group having 2 to 8 carbon atoms, an oxime group, a ketoxime group, a hydrogen atom or an amide group, and a is an integer of 1 to 3. Examples of preferable silanes are methyltrichlorosilane, phenylmethyldichlorosilane, ethyltrimethyoxysilane, phenyltriethoxysilane, vinyltriacetoxysilane, ethyltriacetoxysilane, octylmethyldibutoxysilane and methyltriketomesilane. These cross-linking agents produce cross-links by a reaction such as dealcoholization, deacyloxylation, deamination, deketonization or dehydrogenation.

The cross-linking catalyst, which may be used alone or in combination with the cross-linking agent, includes organometallic compounds such as organotin compounds, organozinc compounds, organotitanium compounds, organoiron compounds and organolead compounds. Examples of suitable organometallic compounds are dibutyltin diacetate, lead naphthenate, cobalt naphthenate, ferric octoate, dibutyltin adipate, tetrabutoxy titanate and zinc naphthenate.

If desired, the reaction product of the organopolysiloxane with the hydroxyl group-containing polymeric material may be used in combination with other polymeric materials or high molecular weight compounds, which are miscible with the reaction product, provided that such materials or compounds do not harmfully affect the resulting printing plate. Usually, the amount of such materials or compounds is not larger than 50% by weight based on the total weight of the aforesaid reaction product and such polymeric materials. The materials or compounds, which may be used in combination with the aforesaid reaction product, include, for example, 1,2-polybutadiene derivatives having no hydroxyl end groups which are derived from hydroxyl-terminated 1,2-polybutadiene, a phenolic resin, poly-n-butyl methacrylate, dioctyl phthalate, soybean oil, long-soybean oil alkyd resins and liquid 1,2-polybutadiene which may be of an 1,2-, 1,4-cis- or 1,4-trans-structure and is not reactive to the organopolysiloxane.

Substrates which can be employed for the printing plate of the invention include, for example, paper, plastic films, metal sheets, synthetic paper (which may be derived from either a plastic film or a pulp), foamed sheets, flexible rubber sheets, and woven or non-woven fabrics coated with flexible plastics or rubber. For the purposes of enhancement of the adhesion to the overlying layer and improvement of the endurance, the substrate may be subjected to a pre-impregnation or coating treatment. The substrates may also be coated with a mixture of a photo conductor, such as zinc oxide, a sensitizing dyestuff and a binder resin, thereby to be made into an electrophotographic copy sheets. Of the aforesaid substrates, paper is preferable from an economical point of view. Among others, so-called coated papers, particularly cast coated paper and coated paper finished by using a super calender, are most preferable. These coated papers are prepared by coating them with a finely divided inorganic loading material and a binder resin, and then, mirror finishing the coated papers. Particularly, cast coated paper is prepared by coating paper with a slurry containing a finely divided inorganic loading material and a binder resin, and then, drying the coated paper having a wet coat while the coat is in contact with a mirror finished, e.g. chrome-plated, surface of a drum dryer. The coated papers have good surface smoothness and special barrier properties, and are popularly available as a printing plate substrate.

The thickness of substrates is not particularly limited. However, a thickness of not larger than 5 mm is conventional for the convenience of printing. The lower limit in the thickness of substrates varies depending upon the strengths of substrates.

The waterless planographic printing plate of the invention is preferably prepared as follows. The hydroxyl group-containing polymeric material and the organopolysiloxane are dissolved in a solvent, followed by the addition of the aforesaid optional cross-linking agent and/or cross-linking catalyst, thereby to prepare a uniform coating solution. The solvent used is capable of dissolving both the hydroxyl group-containing polymeric material and the organopolysiloxane. Examples of suitable solvents are isoparaffinic hydrocarbons, such as Isopar E, aromatic hydrocarbons, such as benzene, toluene and xylenes, ketones, such as cyclohexanone, and ester solvents, such as butyl acetate. The coating solution is coated on a substrate before the reactive polymer ingredients in the solution substantially start a cross-linking reaction and become gel. The coating may be carried out by a conventional coating procedure, such as roll coating, air-knife coating, doctor blade coating, spray coating or slit-die coating. In small scale production, an applicator, a bar coater or a rotational coater may advantageously be used.

The proportion by weight of the organopolysiloxane (A) to the hydroxyl group-containing polymeric material (B) is in the range of A/B=1/99 to 50/50, preferably A/B=3/97 to 30/70 and more preferably A/B=5/95 to 25/75. The amounts of the cross-linking agent (C) and the cross-linking catalyst (D), the use of which is optional but generally preferable, are such that the following formulae are satisfied.

$$(A+B)/C>100/20$$

$$C/D>100/10$$

If desired, the coating solution may contain suitable amounts of additives such as antioxidants, ultraviolet absorbers, dyestuffs and finely divided organic and/or inorganic loading materials. However, finely divided loading materials of a very deep color are not preferable. Examples of suitable loading materials are finely divided silica, talc, kaolin clay, zinc oxide and finely divided high density polyethylene.

The thickness of the coat may be, in terms of dry coat thickness, in the range of from 1 to 100 microns, preferably from 2 to 50 microns and more preferably from 4 to 30 microns.

Simultaneously with and/or after the solvent is allowed to evaporate, the coated substrate is subjected to a heat treatment for effecting the reaction of the hydroxyl group-containing polymeric material with the organopolysiloxane. The heating temperature may be varied in the range of from room temperature to 250° C., preferably from 50° to 200° C. and more preferably from 100° to 180° C. The heating period is usually in the range of from 30 seconds to one hour, particularly from one minute to ten minutes. The heat treatment may be carried out either in the air or in an atmosphere of an inert gas, such as nitrogen, argon and carbon dioxide, and either under normal pressure or under a sightly increased or reduced pressure. The heating means may be conventional, such as hot air heating, radiant heating or roller heating. It is not preferable that the coated surface be maintained in the state of being in contact with a covering, such as plastic film closely adhering to the coated surface, or with a roller surface during the course of heat treatment. The coated surface should be kept free at least for a substantial period of the heating treatment during which condensation or curing is effected.

The coat, i.e, overlying layer, formed on a substrate is characterized as possessing the following cross-sectional structure. The coat consists of a relatively thin surface layer substantially composed of the organopolysiloxane and a relatively thick inner layer sandwiched between the surface layer and the substrate, and having an islands-in-sea heterophase structure composed of the organopolysiloxane islands substantially uniformly dispersed in the polymeric material, such as 1,2-polybutadiene. The surface layer usually has a thickness of not larger than 0.5 micron, preferably not larger than 0.25 micron and more preferably not larger than 0.1 micron. The minimum thickness of the surface layer is not critical. It is presumed that the surface layer may be thicker than the monomolecular layer, i.e., have a thickness of at least approximately 5 angstroms. Examination using an ESCA (Electron Spectroscopy for Chemical Analysis) apparatus, which is capable of analyzing the ingredients present in the region from the outer surface to the depth of approximately 100 angstroms, showns that said region of the coat is predominantly comprised of the organopolysiloxane, and the coated surface consists of areas of the organopolysiloxane and areas of the polymeric material, such as 1,2-polybutadiene. Thus, it is believed that the surface layer is substantially comprised of the organopolysiloxane and has holes through which the inner layer predominantly comprised of the polymeric material, such as 1,2-polybutadience, is exposed. Such a cross-sectional structure can be confirmed also by observing very thin leaf specimens having a thickness of 500 to 1,000 angstroms, which are cut from the coated substrate, by using a transmitting type electron microscope.

The inner layer of the coat, sandwiched between the aforesaid surface layer and the substrate, is of an islands-in-sea heterophase structure composed of the organopolysiloxane islands dispersed in the sea of the polymeric material, such as 1,2-polybutadiene. The organopolysiloxane islands are approximately in the shape of a spindle and/or a sphere. The average length of the minor axes of the spindle-shaped islands is not larger than 0.5 micron, particularly not greater than 0.25 micron and more particularly not greater than 0.1 micron. The ratio of the major axis length to the minor axis length of the spindle-shaped islands is in the range of from 1 to 20, particularly from 1 to 10 and more particularly from 1 to 5 (a ratio of 1 means that the islands are in the shape of a sphere). The spindle-shaped islands are distributed in such a state that the major axes are perpendicular to the coated surface.

The printing plate having the aforesaid overlying layer results, when imaged by using, for example, an electrophotographic copy machine, in an imaged printing plate with an image which is of a good quality and capable of being sufficiently fixed to the substrate. When the imaged printing plate is used as a printing master in printing without being dampened with an aqueous fountain solution, the plate exhibits satisfactory printing endurance and the resulting prints have a very low background contamination.

The formation of an image on the printing plate may generally be carried out by using an electrophotographic copy machine. Either a copy machine for PPC (Plain Paper Copy) or that for CPC (Coated Paper Copy) may conveniently used, depending upon the particular nature of the printing plate. The copy machine may be any of the dry, wet and dry-wet types. The toner can be any conventional ink accepting materials which are widely used in copying or described in references. The image may also be formed directly by handwriting or typewriting.

The imaged printing plate may be subjected to various finishing treatments in order to enhance some of the printing properties. For example, the toner image may be heated under normal pressure or while being pressed, to be thereby softened, in order to improve the adhesion of the toner image to the printing plate. The printing plate with the toner image may be calendered, preferably at an elevated temperature, thereby to make completely flat the entire surface of the printing plate having raised image areas and, consequently, enhance the endurance of the printing plate. The calendering temperature may be sufficiently high for softening the toner material. The correction or erasure of the toner image can be effected in a conventional manner, such as removal of the toner before it is fixed to the printing plate, scraping away the toner after it is fixed to the printing plate and application of an erasing ink (ink-repellent silicone composition) to the toner image.

The imaged printing plate can then be employed in conventional planographic printing equipment without the dampening system. The printing equipment may be either of an offset printing type or of a direct printing type not employing a blanket cylinder. Color printing can be effected in a conventional manner, for example, by using a color printing machine having attached thereto a plurality of the printing plates, each having a toner image for different color printing, or by repeatedly using the same color printing machine to which a plurality of the printing plates, each having a toner image for different color printing, are sequentially attached. A conventional printing ink which is popularly used in lithographic printing may be used. Some printing ink exhibits an affinity to the nonimage areas which is too strong to avoid background contamination. When such printing ink is used, it is preferable to add a silicone oil to the ink. The amount of the silicone oil added should not be greater than 10% by weight, preferably in the range of from 0.5 to 3% by weight, based on the weight of the silicone oil-added ink. The printing paper used can also be conventional, such as various coated papers, fine quality paper, medium quality paper and low quality paper. Water resistant coated paper, which is conventionally used in lithography with an aqueous dampening or fountain solution, may also be used. Furthermore, hydrophobic films, plastics and metals can be used in printing, although these hydrophobic materials cannot be advantageously used in conventional lithography wherein an aqueous fountain solution is employed.

It is believed that the advantages of the waterless planographic printing plate of the invention are brought about by the aforesaid cross-sectional structure of the coat formed on a substrate, which coat consists of a surface layer substantially composed of the organopolysiloxane, and an inner layer sandwiched between the surface layer and the substrate and having an islands-in-sea heterophase structure predominantly comprised of the polymeric material, such as 1,2-polybutadiene, exhibiting a high adhesion to the toner. The organopolysiloxane surface layer has holes through which the polymeric material having a high adhesion to the toner is exposed. Thus, although planographic ink is satisfactorily rejected by the organopolysiloxane surface layer, the toner can be sufficiently attached to the organopolysiloxane surface layer because of the exposed toner-adherent polymeric material.

It is believed that one of the reasons the aforesaid cross-sectional structure is formed is that the coat is formed on a substrate. That is, when the organopolysiloxane and the hydroxyl group-containing polymeric material, both present in the coat as formed on a substrate, are heated to be thereby reacted with each other and cured, the organopolysiloxane is subject to phase separation. Furthermore, if the organopolysiloxane and the hydroxyl group-containing polymeric material are not chemically bonded to each other, phase separation of the organopolysiloxane will occur abruptly and the aforesaid cross-sectional structure will not be formed.

The invention will be further illustrated by the following examples, wherein parts and percents are by weight unless otherwise specified.

EXAMPLE 1

A waterless planographic printing plate was prepared and prints were obtained therefrom as follows.

A uniform coating solution was prepared by mixing the following ingredients.

| | |
|---|---|
| a. Polydimethylsiloxane (supplied by Toray Silicone K.K., average molecular weight = 22,000): | 10 parts |
| b. Hydroxyl-terminated 1,2-polybutadiene ("G-3000" supplied by Nippon Soda K.K., having an average molecular weight of approximately 3,000 and —OH groups on both ends, 1,2-bond content = higher than 90%): | 90 parts |
| c. Ethyl-, methyl-triacetoxysilane (supplied by Toray Silicone K. K.): | 6 parts |
| d. Dibutyltin diacetate: | 0.12 part |
| e. Isopar E (supplied by Esso Chem. K. K.): | 900 parts |

The coating solution was coated on a coated paper fitted to a rotating coater (wheeler), to a coating thickness of approximately 10 microns (in terms of dry coat thickness). The coated paper used was a mirror finished coated paper commercially available with a trade name "GOLD" supplied by Kanzaki Paper-manufacturing K.K., having a basis weight of 127 g/m$^2$. After coating, the coated paper was left to stand at room temperature for five minutes to remove Isopar E and, thereafter, cured for ten minutes in an oven maintained at a temperature of 160° C. The planographic printing plate, so prepared, had a surface slightly less lustrous and somewhat more sticky, compared to that of a conventional planographic printing plate prepared from only a polydimethylsiloxane coating material, i.e., without use of hydroxyl-terminated 1,2-polybutadiene. The planographic printing plate was cut into a B4 size (257 mm×393 mm) and, then, imaged by using a Xerox Model 3103 processor. The processor used was of the PPC (plain paper copy) type, wherein an image was developed on the selenium flat plate with a toner and, then, electrostatically transferred to the surface of a copying paper. The toner image, transferred onto the planographic printing plate, was heated at a temperature of 140° C., in an oven, for ten minutes, to be thereby fixed onto the printing plate.

The imaged planographic printing plate was then employed on an A. B Dick Model 320 offset printing machine, operating with Toyo King Ultra-G ink, supplied by Toyo Ink K.K. More than 1,000 prints could be obtained from fine and common quality papers, which prints had a clean image and a very low background contamination.

EXAMPLE 2

Waterless planographic printing plates were prepared, prints were obtained therefrom and the cross-sections of the printing plates were observed by using an electron microscope, as follows.

Coating solutions were prepared from the following ingredients, which were the same as those used in Example 1.

| | |
|---|---|
| a. Polydimethylsiloxane: | 5 or 20 parts |
| b. Hydroxyl-terminated 1,2-polybutadiene: | 95 or 80 parts |
| c. Ethyl-, methyl-triacetoxysilane: | 6 parts |
| d. Dibutyltin diacetate | 0.12 part |
| e. Isopar E | 900 parts |

Each coating solution was coated on a polyester film (trade name "Lumilar" supplied by Toray Industries Inc., 100 microns thick) fitted to a rotating coater, to a coating thickness of approximately 8 microns (in terms of dry coat thickness). The coated polyester film was left to stand at room temperature to remove the solvent and, thereafter, cured at a temperature of 150° C., in a hot air oven, for 20 minutes. The planographic printing plate, so prepared, was imaged by using a U-Bix model 600 W processor, supplied by Konishiroku K.K. The processor used was of the type wherein an image is developed on a finely divided zinc oxide-coated master paper with a toner and, then, electrostatically transferred to the surface of a common copying paper. The toner image, transferred onto the planographic printing plate, was heated in an oven to be thereby fused.

Offset printing was carried out by using the imaged, polyester base planographic printing plate, in a manner similar to that employed in Example 1 in the absence of dampening. More than 500 prints could be obtained from fine quality paper, which prints exhibited a very low background contamination whether the amount of polydimethylsiloxane in the coating solution was 5 or 20 parts. When the number of prints exceeded 1,000, in the case where the amount of polydimethylsiloxane in the coating solution was 5, the prints exhibited a slight background contamination, but there was observed little or no falling off of the toner image. In contrast, in the case where the amount of polydimethylsiloxane in the coating solution was 20, the prints exhibited little or no background contamination, but fine dotty areas of the toner image had fallen off.

The cross-section of the unimaged planographic printing plate was observed by using an electron microscope as follows. A specimen of the printing plate was embedded in an epoxy resin and, then, cut into thin cross-sectional leaves of several hundred angstroms in thickness. The observation of the leaves by using a transmitting type electron microscope of 60,000 magnification showed that the coat on the polyester base consisted of a thin surface layer, and a thick inner layer sandwiched between the surface layer and the polyester base. The thin surface layer was approximately 100 to 400 angstroms thick and had holes, and was substantially composed of the organopolysiloxane. The thick inner layer was of an islands-in-sea heterophase structure composed of the hydroxyl-terminated 1,2-polybutadiene sea and the organopolysiloxane islands substantially uniformly dispersed in the hydroxyl-terminated 1,2-polybutadiene sea. The greater part of the organopolysiloxne islands was in the shape of a spindle, the lengths of the major and minor axes of which were from approximately 200 to 1,000 angstroms and from approximately 50 to 400 angstroms, respectively. A minor part of the organopolysiloxane islands was in the shape of a sphere. The spherical islands were distributed in a higher density in vicinity to the surface layer than in the other portions. The spindle-shaped islands were distributed in a state such that the major axis was perpendicular to the surface layer or the coat. From these facts, it can readily be imagined that the fine organopolysiloxane particles become spindle-shaped while moving toward the outer surface. There was no great difference in the islands-in-sea heterophase structure between the two coats formed with 5 parts and 20 parts of the organopolysiloxane, except for the density of the organopolysiloxane islands.

Examination using an ESCA (Electron Spectroscopy for Chemical Analysis) apparatus, which was capable of analyzing the ingredients present in the region from the outer surface to the depth of approximately 100 angstroms, also showed that the coat had a thin surface layer substantially composed of the organopolysiloxane. It was presumed that the thin organopolysiloxane surface layer had holes in which the hydroxyl-terminated 1,2-polybutadine was exposed.

EXAMPLE 3

Waterless planographic printing plates were prepared in a manner similar to that mentioned in Example 2, except that coating solutions were prepared from the following ingredients which were the same as those used in Example 1.

| | |
|---|---|
| a. Polydimethylsiloxane: | 100, 80, 60, 40, 10 or 1 part |
| b. Hydroxyl-terminated 1,2-polybutadiene: | 0, 20, 40, 60, 90 or 99 parts (a + b = 100 parts) |
| c. Ethyl-, methyl-triacetoxysilane: | 6 parts |
| d. Dibutyltin diacetate: | 0.12 part |
| e. Isopar E: | 900 parts |

Furthermore, a polyester film "Lumilar" having a thickness of 125 microns was used as the base material, and the curing of the coat was effected at a temperature of 150° C. for a period of 20 minutes. All other conditions remained substantially the same.

Each unimaged planographic printing plate, so prepared, was not imaged, and its printing endurance and formation of background contamination were tested as follows. The planographic printing plates, which had the coats of different a/b proportions, were cut into strips. These strips were adhered to a B4 size paper by using double-coated adhesive tapes. The strips-adhered paper was fitted onto a printing cylinder of an A. B Dick Model 320 offset printing machine. The printing cylinder was rotated at a speed of 120 r.p.m. in the state of being in contact with the blanket cylinder and ink supplied from an ink applicating roller. The ink used was "SMS Aqualess SUMI (Black)S", supplied by Toyo Ink K.K. After the printing cylinder was operated for 8,000 revolutions, printing was carried out by using coated paper, whereby the printing endurance of the printing plate and the adherence to ink of the printing plate were examined from the resulting prints. The printing plates having the coats of the a (organopolysiloxane)/b (1,2-polybutadiene) weight proportion ranging from 40/60 to 1/99 produced prints having little or no background contamination, indicating that these coats exhibit an ink repellency of approximately the same extent as that of the coat obtained from the polydimethylsiloxane only. In contrast, the printing plates having the coats of the a/b weight proportion ranging from 80/20 to 60/40 produced prints having large black solid areas, indicating that the coats were at least partially separated from the printing plate base by their repeated contact with the blanket cylinder. When the coat of the a/b weight proportion of 5/95 and the coat of the a/b weight proportion of 1/99 were compared with each other, both coats produced prints having little or no background contamination when printed with a minor amount of ink. However, when printed with a large amount of ink, the coat of the a/b=1/99 produced prints having background contamination, while the coat of the a/b=5/95 produced prints of little or no background contamination. The above-mentioned results show that, when the relative amount of organopolysiloxane is small, i.e., when the coat has an islands-in-sea structure such that fine organopolysiloxane particles are dispersed in a 1,2-polybutadiene matrix, the coat exhibits excellent strength and endurance to printing and satisfactory ink repellency.

EXAMPLE 4

Waterless planographic printing plates of a B4 size were prepared in a manner similar to that mentioned in Example 3, wherein coating solutions were prepared from the following ingredients, which were the same as those used in Example 1.

| | |
|---|---|
| a. Polydimethylsiloxane: | 100, 80 or 1 part |
| b. Hydroxyl-terminated 1,2-polybutadiene: | 0, 20 or 99 parts (a + b = 100 parts) |
| c. Ethyl-, methyl-triacetoxysilane: | 6 parts |
| d. Dibutyltin diacetate: | 0.12 part |
| e. Isopar E: | 900 parts |

The planographic printing plates so prepared were imaged by using a Xerox Model 3103 processor and, thereafter, cured in a manner similar to that mentioned in Example. Printing was also effected in a manner similar to that mentioned in Example 1.

The printing plate with the coat formed from 100 parts of the polydimethylsiloxane, i.e., without the use of 1,2-polybutadine, produced no satisfactory print. This is because the toner image fell off during the printing. The printing plate with the coat formed from the polydimethylsiloxane/hydroxyl-terminated 1,2-polybutadiene 80/20 mixture also produced no satisfactory prints. When the number of prints reached approximately 50, the toner image completely fell off and the coat collapsed. In contrast, the printing plate with the coat formed from the polydimethylsiloxane/hydroxyl-terminated 1,2-polybutadiene 80/20 mixture produced prints having a clean image and no background contamination, even when the number of prints reached approximately 100. Thereafter, the printing cylinder having the latter printing plate fitted thereto was rotated a further 2,000 revolutions without the supply of coated papers and in the state of being in contact with the blanket cylinder and ink, and then, printing was continued by supplying coated papers. The resultant prints had no background contamination and a clean image.

EXAMPLE 5

Following a procedure similar to that mentioned in Example 1, a planographic printing plate was prepared and prints were obtained therefrom, wherein a modified polydimethylsiloxane, the methyl groups of which had been partially substituted by a vinyl group (the proportion of the vinyl groups/the unsubstituted methyl groups was 10/90 by moles), was used for the preparation of a coating solution instead of the polydimethylsiloxane. All other conditions remained substantially the same. More than 900 offset prints having a clean image and no background contamination could be obtained.

EXAMPLE 6

Following a procedure similar to that mentioned in Example 1, a planographic printing plate was prepared and prints were obtained therefrom, wherein 1,2-polybutadiene having no hydroxyl end groups was used for the preparation of a coating solution instead of the hydroxyl-terminated 1,2-polybutadiene. The 1,2-polybutadiene used was commercially available under the trade name "B-3,000" (supplied by Nippon Soda K.K.), and had an average molecular weight of 3,000 and an 1,2-bond content of at least 90%. All other conditions remained substantially the same.

The toner image of the printing plate fell off before the number of prints reached approximately 50. It is considered that 1,2-polybutadiene having no hydroxyl end groups, i.e., having saturated hydrocarbon end groups, is chemically inert to organopolysiloxanes and, thus, incapable of forming an islands-in-sea heterophase structure as hereinbefore explained. This was confirmed by electron microscopy and electron spectroscopy for chemical analysis.

EXAMPLE 7

Following a procedure similar to that mentioned in Example 1, a waterless planographic printing plate was prepared and prints were obtained therefrom, wherein offset printing was effected by using the following ink instead of "Toyo King Ultra-G" ink. The ink used was a uniform mixture comprised of 98 parts of an A. B Dick offset ink and 2 parts of silicone having a viscosity of 100 cps ("SH-200" supplied by Toray Silicone K. K.). All other conditions remained substantially the same. By the incorporation of silicone in an A. B Dick offset ink, the printing endurance was enhanced and, thus, more than 2,000 satisfactory prints could be obtained.

The A. B Dick offset ink used is suitable for in-plant or in-house offset printing by the use of a dampening solution. If offset printing is effected by using the A. B Dick offset ink in the absence of dampening, prints of high background contamination will be obtained, even when the waterless planographic printing plate of the invention is employed.

EXAMPLE 8

Following a procedure similar to that mentioned in Example 1, a waterless planographic printing plate was prepared and prints were obtained therefrom, wherein the imaged planographic printing plate prior to its use for offset printing was calender-finished at a pressure of approximately 15 kg/cm$^2$, thereby to make the surface thereof having raised imaged areas flat. All other conditions remained substantially the same. The printing endurance was enhanced by the calender-finish and, thus, more than 2,000 satisfactory prints could be obtained.

EXAMPLE 9

The mirror finished coated paper "GOLD", supplied by Kanzaki Paper-manufacturing K.K., having a basis weight of 127 g/m$^2$, was coated with a coating solution similar to that used in Example 1, by using a bar coater at a coating thickness of approximately 6 microns. The coated paper was left to stand at room temperature for three minutes and 15 seconds, thereby to be dried, and thereafter, cured at a temperature of 170° C. for three minutes. The unimaged planographic printing plate, so prepared, was imaged by using a Cannon NP Model 5,100 processor. The processor used was of a hot roll fixing type, which was different in the toner used from that used in a processor such as Xerox Model 3103 and U-Bix, which are of an oven fixing type. The imaged planographic printing plate was heated at a temperature of 150° C. for 20 seconds and, thereafter, employed on an A. B Dick Model 320 offset printing machine, operating with ink similar to that used in Example 7. More than 1,000 prints having a clean image and no background contamination could be obtained.

EXAMPLE 10

In this Example, a waterless planographic printing plate was prepared in a manner approximately similar to that mentioned in Example 1, except that a reaction product of hydroxyl-terminated 1,2-polybutadiene and 4,4'-diphenylmethylene diisocyanate (hereinafter referred to as "MDI" for brevity) was used instead of the hydroxyl-terminated 1,2-polybutadiene.

The above-mentioned reaction product was prepared as follows. 18.04 g ($9.02\times10^{-3}$ mol) of hydroxyl-terminated 1,2-polybutadiene ("G-2000" supplied by Nippon Soda K.K., having an average molecular weight of approximately 2,000 and —OH groups on both ends) and 1.13 g ($4.51\times10^{-3}$ mol) of MDI were separately dissolved in Isopar E in a nitrogen atmosphere. These two solutions were combined together at room temperature to obtain a solution containing 20% of the total of the —OH terminated 1,2-polybutadiene and the MDI. The solution was left to stand for a period of one week. Molecular weight and molecular weight distribution of the reaction product so obtained were determined by gel-permeation chromatography. The results were as follows.

| | MN | MW/MN |
|---|---|---|
| G 2000 | 3,120 | 1.25 |
| Reaction product of G 2000 with MDI | 5,190 | 1.89 |

MN = number average molecular weight
MW = weight average molecular weight

It is presumed that the reaction product is predominantly comprised of a hydroxyl-terminated polymer having a chemical structure such that two molecules of the hydroxyl-terminated 1,2-polybutadiene "G-2000" are bonded with one molecule of MDI by urethane bonds.

A coating solution was prepared from the following ingredients, which were the same as those used in Example 1.

| | |
|---|---|
| a. Polydimethylsiloxane | 10 parts |
| b. —OH terminated 1,2-polybutadiene/MDI reaction product | 90 parts |
| c. Ethyl-, methyl-triacetoxysilane | 6 parts |
| d. Dibutyltin diacetate | 0.12 part |
| e. Isopar E | 900 parts |

Using this coating solution, an unimaged planographic printing plate was prepared in a manner similar to that mentioned in Example 1. The resultant printing plate had an appearance similar to that prepared in Example 1. Image formation and offset printing were effected in a manner similar to that mentioned in Example 7. More than 1,000 prints having a clean image and no background contamination could be obtained.

EXAMPLE 11

In this example, a waterless planographic printing plate was prepared in a manner similar to that mentioned in Example 1, except that a reaction product of 1,2-polybutadiene having not hydroxyl but hydrocarbon end groups with mercaptoethanol was used, instead of the hydroxyl-terminated 1,2-polybutadiene.

The above-mentioned reaction product was prepared as follows. 99.7 g (0.0332 mole) of 1,2-polybutadien "B-3000", supplied by Nippon Soda K.K., having an average molecular weight of approximately 3,000 and a specific gravity of 0.87, were combined with 20 g of dioxane in a nitrogen atmosphere to obtain a solution. This solution was heated to a temperature of 80° C. Then, 8.4 g (0.108 mole) of mercaptoethanol were added drop by drop to the solution over a period of approximately 15 minutes, while the solution was stirred at a temperature of 80° C. After completion of the addition, the mixture was maintained at a temperature of 80° C. for 8.5 hours, to be thereby reacted. Thereafter, the reaction mixture was placed under vacuum at an elevated temperature, whereby dioxane was removed therefrom. The reaction product so obtained was dissolved in a mixed solvent of Isopar E/butyl acetate=4/1 by weight to obtain a solution of 20% concentration. It is presumed that mercaptoethanol reacted substantially quantitatively, and provided a reaction product having three hydroxyl groups, an average, per molecule of the 1,2-polybutadiene.

Image formation on the unimage printing plate so prepared and offset printing were effected in a manner similar to that mentioned in Example 7. More than 500 prints having a clean image and no background contamination could be obtained.

EXAMPLE 12

A waterless planographic printing plate was prepared and prints were obtained therefrom as follows.

A uniform coating solution was prepared by mixing the following ingredients.

| | |
|---|---|
| a. Polydimethylsiloxane (supplied by Toray Silicone K.K., average molecular weight = 22,000): | 20 parts |
| b. Phenol novolak resin ("Sumilite resin PR 50235" supplied by Sumitomo Bakelite K.K.): | 80 parts |
| c. Ethyl-, methyl-triacetoxysilane (Ethyl/methyl ratio = 1/1 by mole, supplied by Toray Silicone K.K.): | 6 parts |
| d. Dibuthyltin diacetate: | 0.12 part |
| e. Butyl acetate: | 900 parts |

The coating solution was coated on a coated paper similar to that used in Example 1, by using a bar coater, to a coating thickness of approximately 5 microns (in terms of dry coat thickness). The coated paper was dried at room temperature and, then, cured at a temperature of 160° C., in a hot air oven, for three minutes. The unimaged planographic printing plate, so prepared, was imaged in a manner similar to that mentioned in Example 1. Offset printing was effected by using a printing machine and ink, both similar to those employed in Example 3. More than 500 prints having a clean image and no background contamination could be obtained.

EXAMPLE 13

In this example, a waterless planographic printing plate was prepared in a manner similar to that mentioned in Example 12, except that a copolymer of n-butyl methacrylate (hereinafter referred to as "BMA" for brevity) and 2-hydroxyethyl methacrylate (hereinafter referred to as "HEMA" for brevity) was used instead of the phenol novolak resin.

The above-mentioned copolymer was prepared as follows. A mixture of 95 parts of BMA, 5 parts of HEMA, 1 part of azobisisobutyronitrile, 1 part of dodecyl mercaptan and 100 parts of butyl acetate was maintained at a temperature of 95° C., in a nitrogen atmosphere, for 45 minutes to effect polymerization. 0.5 g of 2,6-di-tert.-butyl-4-methylphenol (polymerization inhibitor) was added to the polymerization mixture and, then, unreacted monomer was removed therefrom.

A coating solution was prepared from the following ingredients, which were the same as those used in the previous examples except for ingredient b.

| | |
|---|---|
| a. Polydimethylsiloxane: | 10 parts |
| b. BMA/HEMA copolymer: | 90 parts |
| c. Methyl-, ethyl-triacetoxysilane: | 6 parts |
| d. Dibutyltin diacetate: | 0.12 part |
| e. Isopar E/butyl acetate mixture (4/1 by weight): | 800 parts |

The coating thickness was approximately 6 microns in terms of dry coat thickness.

The unimaged planographic printing plate so prepared was imaged in a manner similar to that mentioned in Example 1. Offset printing was effected by using a printing machine and ink, both similar to those used in Example 7. More than 500 prints having a clean image and low background contamination could be obtained.

The above-mentioned procedures for the preparation of the planographic printing plate and for the offset printing were repeated, wherein a lauryl methacrylate/-HEMA (95/5 by weight) copolymer was used instead of the BMA/HEMA (95/5 by weight) copolymer, with all other conditions remaining substantially the same. More than 500 prints could be obtained, but they had slightly lower background contamination than those obtained by the use of the BMA/HEMA copolymer.

EXAMPLE 14

A coating solution similar to that used in Example 1 was coated under irradiation with yellow light on a commercially available electrophotographic master paper "Elefax QPL-1" (supplied by Iwasaki Tsushinki K.K.) to a coating thickness of approximately 3 microns in terms of dry coat thickness. The coated master paper was dried at room temperature and, then, heat-treated at a temperature of 50° C. for one minute, and further, at a temperature of 130° C. for 10 minutes. The unimaged planographic printing plate so prepared was imaged with toner by a wet procedure by using a Model AP-1 processor, supplied by Iwasaki Tsushinki K.K. The imaged printing plate had slight background contamination, but the toner image was of a similar quality to that formed on the uncoated master paper. Offset printing was effected in a manner similar to that mentioned in Example 7. Approximately 200 prints which had low background contamination but a clean image could be obtained.

What we claim is:

1. A waterless planographic printing plate having toner image areas of ink receptivity and non-image areas of ink releasability, which plate comprises a substrate and an overlying layer coated on the substrate, said overlying is predominantly comprised of a reaction product of 50 to 99% by weight of a polymeric material selected from the group consisting of phenol resins, 1, 2-polybutadiene or its derivatives and acrylate or methacrylate resins, said polymeric material having, on the average, at least two hydroxyl groups per molecule and exhibiting a high adhesion to the ink-receptive toner, and 1 to 50% by weight of an organopolysiloxane having hydroxyl end groups.

2. A waterless planographic printing plate according to claim 1, wherein said polymeric material having, on the average, at least two hydroxyl groups is a hydroxyl group-containing 1,2-polybutadiene or its derivatives, having an 1,2-bond content of at least approximately 50% and a molecular weight of not larger than approximately 10,000.

3. A waterless planographic printing plate according to claim 2, wherein said 1,2-polybutadiene or its derivatives have an 1,2-bond content of at least 90%.

4. A waterless planographic printing plate according to claim 2, wherein said 1,2-polybutadiene or its derivatives have a molecular weight of from approximately 500 to 5,000.

5. A waterless planographic printing plate according to claim 2 or 3, wherein said 1,2-polybutadiene is hydroxyl-terminated 1,2-polybutadiene.

6. A waterless planographic printing plate according to claim 1, wherein said reaction product is formed on the substrate from a coating solution containing the hydroxyl group-containing polymeric material and the organopolysiloxane in amounts of 50 to 99% by weight and 1 to 50% by weight, respectively, based on the total weight of the hydroxyl group-containing polymeric material and the organopolysiloxane.

7. A waterless planographic printing plate according to claim 1 or 6, wherein the amounts of the hydroxyl group-containing polymeric material and the organopolysiloxane are 70 to 97% by weight and 3 to 30% by weight, respectively.

8. A waterless planographic printing plate according to claim 6, wherein said coating solution further contains at least one compound selected from group consisting of cross-linking agents and cross-linking catalysts.

9. A waterless planographic printing plate according to claim 6, wherein said coating solution further contains a cross-linking agent and a cross-linking catalyst, the amount (C) of said cross-linking agent and the amount (D) of said cross-linking catalyst satisfying the formulae:

$$(A+B)/C>100/20$$

$$C/D>100/10$$

wherein A and B are the amounts of the organopolysiloxane and the hydroxyl group-containing polymeric material, respectively.

10. A waterless planographic printing plate according to claim 8 or 9, wherein the cross-linking agent is a silane represented by the general formula:

$$R_{4-a}SiX_a$$

wherein R is a hydrocarbon radical having 1 to 18 atoms, X is a hydrolyzable radical and a is an integer of 1 to 3.

11. A waterless planographic printing plate according to claim 8 or 9, wherein the cross-linking catalyst is at least one compound selected from the group consisting of organotin compounds, organozinc compounds, organotitanium compounds, organoiron compounds and organolead compounds.

12. A waterless planographic printing plate according to claim 1, wherein said substrate is cast coated paper or coated paper finished by using a super calender.

13. A waterless planographic printing plate according to claim 1, wherein said overlying layer consists of a relatively thin surface layer substantially composed of the organopolysiloxane and a relatively thick thin layer sanwiched between the surface layer and the substrate; said inner layer having an islands-in-sea heterophase structure composed of the organopolysiloxane islands substantially uniformly disposed in the sea of the polymeric material.

14. A waterless planographic printing plate according to claim 13, wherein said surface layer has a thickness of from approximately 5 angstroms to 0.5 microns.

15. A waterless planographic printing plate according to claim 13 or 14, wherein said surface layer has holes through which the inner layer predominantly composed of the polymeric material is exposed.

* * * * *